(12) United States Patent
Wang et al.

(10) Patent No.: US 6,472,317 B1
(45) Date of Patent: Oct. 29, 2002

(54) DUAL DAMASCENE ARRANGEMENT FOR METAL INTERCONNECTION WITH LOW K DIELECTRIC CONSTANT MATERIALS IN DIELECTRIC LAYERS

(75) Inventors: Fei Wang, San Jose, CA (US); Jerry Cheng, Milpitas, CA (US); Simon S. Chan, Saratoga, CA (US); Todd Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 77 days.

(21) Appl. No.: 09/780,457

(22) Filed: Feb. 12, 2001

Related U.S. Application Data

(62) Division of application No. 09/225,542, filed on Jan. 5, 1999, now Pat. No. 6,255,735.

(51) Int. Cl.⁷ .......................................... H01L 21/4763
(52) U.S. Cl. ...................... 438/638; 438/637; 438/624; 438/738
(58) Field of Search .......................... 437/638, 637, 437/624, 634, 672, 675, 737, 738, 743

(56) References Cited

U.S. PATENT DOCUMENTS

| | | | |
|---|---|---|---|
| 5,310,454 A | 5/1994 | Ohiwa et al. | |
| 5,340,370 A | 8/1994 | Cadien et al. | |
| 5,354,712 A | 10/1994 | Ho et al. | |
| 5,612,254 A | 3/1997 | Mu et al. | |
| 5,659,201 A | 8/1997 | Wollesen | |
| 5,679,608 A | 10/1997 | Cheung et al. | |
| 5,693,563 A | 12/1997 | Teong | |
| 5,705,430 A | 1/1998 | Avanzino et al. | |
| 5,736,457 A | 4/1998 | Zhao | |
| 5,739,579 A | 4/1998 | Chiang et al. | |
| 5,741,626 A | 4/1998 | Jain et al. | |
| 5,801,094 A | 9/1998 | Yew et al. | |
| 5,817,572 A | 10/1998 | Chiang et al. | |
| 5,861,677 A | 1/1999 | You et al. | |
| 5,880,018 A | 3/1999 | Boeck et al. | |
| 5,916,823 A | 6/1999 | Lou et al. | |
| 5,949,143 A | 9/1999 | Bang | |
| 6,083,822 A | 7/2000 | Lee | |
| 6,153,514 A * | 11/2000 | Wang et al. | 438/624 |
| 6,235,628 B1 * | 5/2001 | Wang et al. | 438/622 |
| 6,291,887 B1 * | 9/2001 | Wang et al. | 257/751 |

OTHER PUBLICATIONS

Stanley Wolf and Richard Tauber, Silicon Processing the VLSI Era, vol. 1, pp. 555.

* cited by examiner

Primary Examiner—Kevin M. Picardat

(57) ABSTRACT

A method of forming a dual damascene structure in a semiconductor device arrangement forms a first low k dielectric material over an underlying metal interconnect layer, such as a copper interconnect layer. A second low k dielectric layer is formed on the first low k dielectric layer. A via is etched into the first low k dielectric layer, and a trench is then etched into the second low k dielectric layer. The first and second low k dielectric materials are different from one another so that they have different sensitivity to at least one etchant chemistry. Further etching of the first dielectric layer is prevented during the etching of the trench in the second dielectric layer by employing an etch chemistry that etches only the second low k dielectric material and not the first low k dielectric material.

13 Claims, 5 Drawing Sheets

DUAL DAMASCENE ARRANGEMENT FOR METAL INTERCONNECTION WITH LOW K DIELECTRIC CONSTANT MATERIALS IN DIELECTRIC LAYERS

This application is a Divisional of application Ser. No. 09/225,542 filed Jan. 5, 1999, now U.S. Pat. No. 6,255,735.

RELATED APPLICATIONS

The present application contains subject matter related to subject matter disclosed in copending U.S. patent applications Ser. No. 09/225,220, filed on Jan. 4, 1999, Ser. No. 09/225,215, filed on Jan. 4, 1999 and Ser. No. 09/225,545 filed on Jan. 5, 1999

FIELD OF THE INVENTION

The present invention relates to the formation of metal interconnection layers during the manufacture of semiconductor devices, and more particularly to the formation of a damascene structure in a metal interconnect region.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising 5 or more levels of metalization are becoming more prevalent as device geometries shrink to submicron levels.

A conductive plug filling a via hole is typically formed by depositing a dielectric interlayer on a conductive layer comprising at least one conductive pattern, forming an opening in the dielectric interlayer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and, hence, the circuit speed. As integration density increases and feature size decreases in accordance with sub-micron design rules, e.g., a design rule of about $0.18\mu$ and below, the rejection rate due to integrated circuit speed delays severely limits production throughput and significantly increases manufacturing costs.

In prior technologies, aluminum was used in very large scale integration interconnect metalizations. Copper and copper alloys have received considerable attention as a candidate for replacing aluminum in these metalizations. Copper has a lower resistivity than aluminum and improved electrical properties vis-à-vis tungsten, making copper a desirable metal for use as a conductive plug as well as conductive wiring.

In the formation of a dual damascene structure, a conductive line and vias that connect the line to conductive elements in a previously formed underlying conductive interconnect layer, are simultaneously deposited. The conductive material is deposited into openings (e.g., via holes and trenches) created in dielectric material that overlays the conductive interconnect layer. Typically, a first layer of dielectric material is deposited over a bottom etch stop layer that covers and protects the conductive interconnect layer. A middle etch stop layer is then deposited over the first dielectric layer, followed by deposition of a second dielectric layer. A via hole is then etched through the second dielectric layer, the middle etch stop layer, and the second dielectric layer. A trench is then etched in the second dielectric layer. The trench at least partially overlaps the via hole. The etching of the trench thus stops at the middle stop layer. The bottom etch stop layer within the via hole, which has protected the conductive material in the conductive interconnect layer, is then removed with a different etchant chemistry. With the via holes now formed in the first dielectric layer and a trench formed in the second dielectric layer, conductive material is simultaneously deposited in the via and the trench in a single deposition step. (If copper is used as the conductive material, a barrier layer is conventionally deposited first, to prevent copper diffusion.) The conductive material makes electrically conductive contact with the conductive material in the underlying conductive interconnect layer.

In efforts to improve the operating performance of a chip, low k dielectric materials have been increasingly investigated for use as replacements for dielectric materials with higher k values. Lowering the overall k values of the dielectric layers employed in the metal interconnect layers lowers the RC of the chip and improves its performance. However, the low k materials, such as benzocyclobutene (BCB), hydrogen silsesquioxane (HSQ), SiOF, and the material sold under the trade name of FLARE, are often more difficult to handle than traditionally employed higher k materials, such as an oxide.

When forming a dual damascene structure in which a low k dielectric material, such as BCB, is substituted for higher k dielectric materials in the two dielectric layers in which the vias and the trench are created, the problem of "undercutting" becomes a concern. Undercutting is the undesired enlargement of the via hole in the first dielectric layer, under the middle etch stop layer, during the etching of the trench in the second dielectric layer. The undercutting occurs since the low k dielectric material in the first dielectric layer reacts to the etchant when it is applied to the low k dielectric material in the second dielectric layer. The first dielectric layer is somewhat protected by the middle stop layer, but the etchant still often undercuts the first dielectric layer underneath the middle stop layer. The undercutting causes the ultimately formed via structure to be incorrectly shaped.

The nitride etch stop layer increases the overall k value of the film, since it remains in place in the final product. Nitride has a relatively high k value, especially compared with low k materials. Hence, the sought for reduction in the overall k value gained by the use of low k dielectric materials in the dielectric layers of dual damascene arrangement is offset somewhat by the higher k value of the nitride etch stop layer.

There is a need for a method and arrangement that provides a film with a lower overall dielectric constant value that will exhibit improved overall performance, yet avoids the undercutting that occurs with the use of a low k dielectric material in the dielectric layers of a dual damascene interconnect arrangement, and at the same time reduces the contribution to a higher overall k value introduced by a nitride etch stop layer between the dielectric layers.

SUMMARY OF THE INVENTION

This and other needs are met by the present invention which provides a method of forming an opening in dielectric interconnect layers by forming a first dielectric layer over a conductive layer. The first dielectric layer comprises a first low k dielectric material. A second dielectric layer is formed on the first dielectric layer and comprises a second low k dielectric material having different etch sensitivity than the first low dielectric material to at least one etchant chemistry. A first opening is etched through the first dielectric layer. A second opening is then etched in the second dielectric layer, the second opening at least partially overlapping the first opening.

The earlier stated needs are met by another embodiment of the present invention that provides a dual damascene arrangement having a conductive layer and a first dielectric layer over the conductive layer. The first dielectric layer comprises a first low k dielectric material. A second dielectric layer is on the first dielectric layer and comprises a second low k dielectric material having different etch sensitivity than the first low k dielectric material to at least one etchant chemistry. A first opening extends through the first dielectric layer to the conductive layer. A second opening extends through the second dielectric layer to the conductive layer. Conductive material fills the first and second openings.

The use of different low k materials in the respective dielectric layers of a dual damascene arrangement that are selected to have different etch sensitivity to at least one etchant chemistry, in accordance with embodiments of the present invention, allows one dielectric layer to be etched without further etching of the other dielectric layer during a dual dielectric formation process. This also allows the elimination of an etch stop layer formed of a higher k value material, such as oxide or nitride. The elimination of the etch stop layer reduces the overall k value of the film and thereby increases the operating speed of the chip.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings, and description are to be regarded as illustrative in nature, and not as restrictive.

DETAILED DESCRIPTION OF THE INVENTION

The present invention solves problems associated with the use of low k dielectric materials in the dielectric layers of a dual damascene arrangement in a metal interconnect region of a semiconductor chip. Specifically, the present invention lowers the overall dielectric constant value of the film by providing different low k dielectric materials in the two respective dielectric layers in a dual damascene arrangement. The different low k dielectric materials are selected so as to have different sensitivity to at least one etchant chemistry. This allows the second feature, such as a trench, to be etched into the second dielectric layer without simultaneously etching the first dielectric layer. This also allows the elimination of an etch stop layer between the two dielectric layers, thereby further reducing the overall k value of the film.

Figure 1:
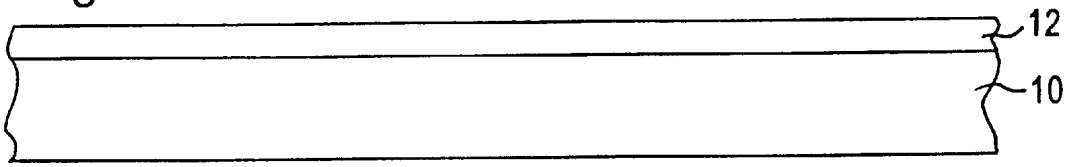
FIG. 1 is a cross-section of a metal interconnect portion of a semiconductor wafer after a first etch stop layer is deposited on an underlying conductive interconnect layer, in accordance with embodiments of the present invention.

FIG. 1 depicts a cross-section of a metal interconnect portion of a chip processed in accordance with embodiments of the present invention, at one stage of the processing. At this stage, a conductive layer 10 has been formed, which may be made of a metal, for example, or other conductive material. In especially preferred embodiments, the conductive material is copper or a copper alloy, due to the earlier stated advantages of copper over other metals. A first etch stop layer 12 is formed, by deposition, for example, over the conductive layer 10. The first etch stop layer 12, in certain embodiments, is made of silicon nitride. The primary purpose of the first etch stop layer 12 is to protect the conductive material during etching of the upper dielectric layers.

Figure 2:
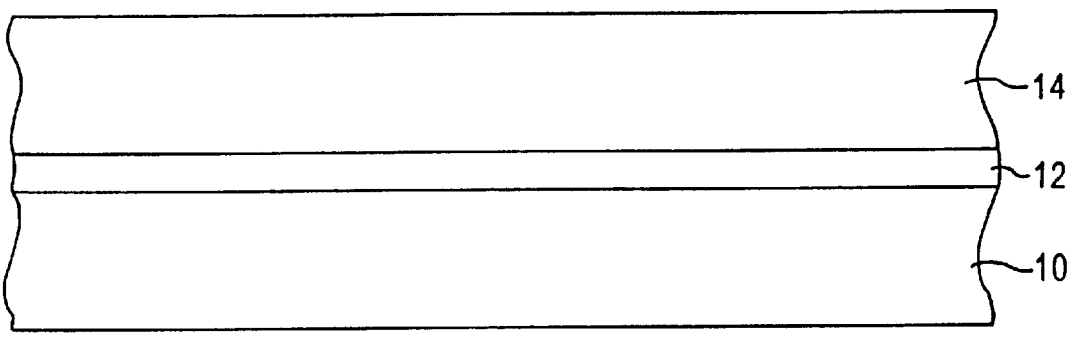
FIG. 2 is a cross-section of the metal interconnect portion of FIG. 1 after a first low k dielectric layer is formed on the first etch stop layer, in accordance with embodiments of the present invention.

As shown in FIG. 2, a first dielectric layer 14 is then formed on the first etch stop layer 12. The dielectric material in the first dielectric layer 14 is a low k (i.e., k<4) dielectric material. The low k dielectric material is spin-coated on the first dielectric layer 14 in certain embodiments. A number of different low k dielectric materials may be used to form the first dielectric layer 14. For example, the low k dielectric material may be a polymer based material, such as benzocyclobutene (BCB) or FLARE, or a silicon dioxide based material, such as hydrogen silsesquioxane (HSQ) or SiOF. In the following described exemplary embodiment, the low k dielectric material employed in the first dielectric layer 14 is assumed to be a silicon dioxide based material, such as HSQ.

The low k dielectric material may be formed to a desired thickness, depending on the application required. For purposes of example, assume that the dielectric layer 14 is formed to a thickness of between about 4000 and about 8000 Å.

Figure 3:
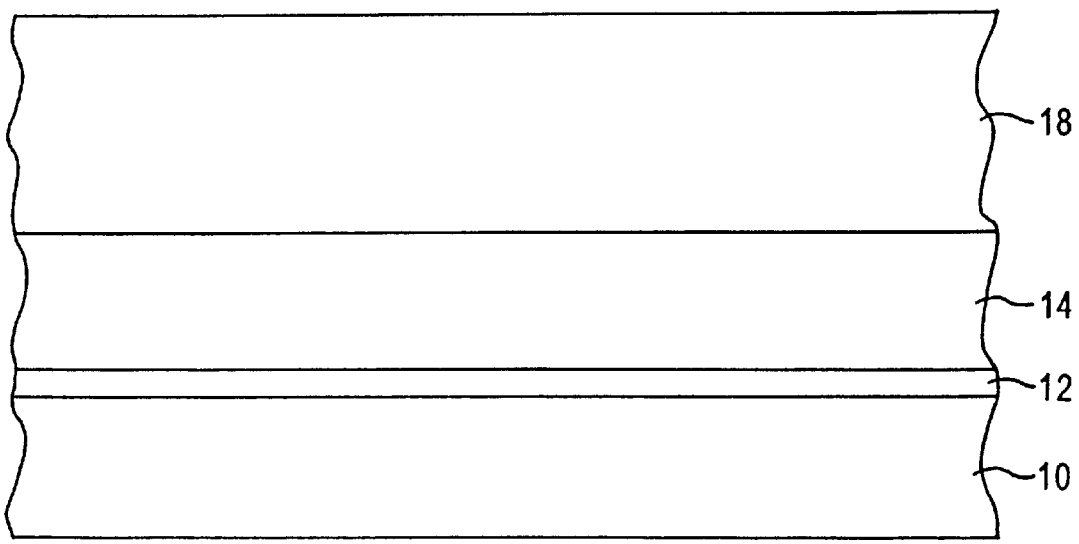
FIG. 3 is a cross-section of the portion of FIG. 2 following the formation of a second low k dielectric layer on the first low k dielectric layer, in accordance with embodiments of the present invention.

FIG. 3 is a cross-section of the metal interconnect portion of FIG. 2 following the formation of the second dielectric layer 18 over the first dielectric layer 14. In preferred embodiments of the present invention, the second dielectric layer 18 comprises a low k dielectric material that is spin-coated on the first dielectric layer 14. This material may be a silicon dioxide based low k dielectric material or a polymer based low k dielectric material. However, in order to avoid overetching of the low k dielectric material in the first dielectric layer 14, the low k dielectric material in the second dielectric layer 18 needs to have a different sensitivity than the low k dielectric material in the first dielectric layer 14 to at least one etchant chemistry. This allows the second dielectric layer 18 to be etched while preventing significant etching of the first dielectric layer 14. It also permits the total elimination of an etch stop layer between the two dielectric layers 14, 18.

In the exemplary described embodiment, it has been assumed that the low k dielectric material in the first dielectric layer 14 is a silicon dioxide based low k dielectric material, such as HSQ. In order to achieve the desired difference in etching sensitivity (i.e., "selectivity"), the low k dielectric material comprising the second dielectric layer 18 is then selected to be a polymer based low k dielectric material, such as BCB. The advantages of providing different types of low k dielectric materials in the two dielectric layers 14, 18 will become more apparent during the later discussion of the etching steps.

Although the invention is being described with the assumption that the first dielectric layer 14 contains a silicon dioxide based low k dielectric material and the second dielectric layer 18 contains a polymer based low k dielectric material, in other embodiments of the invention, the first dielectric layer 14 contains a polymer based material and the second dielectric layer 18 contains a silicon dioxide based material.

Figure 4:
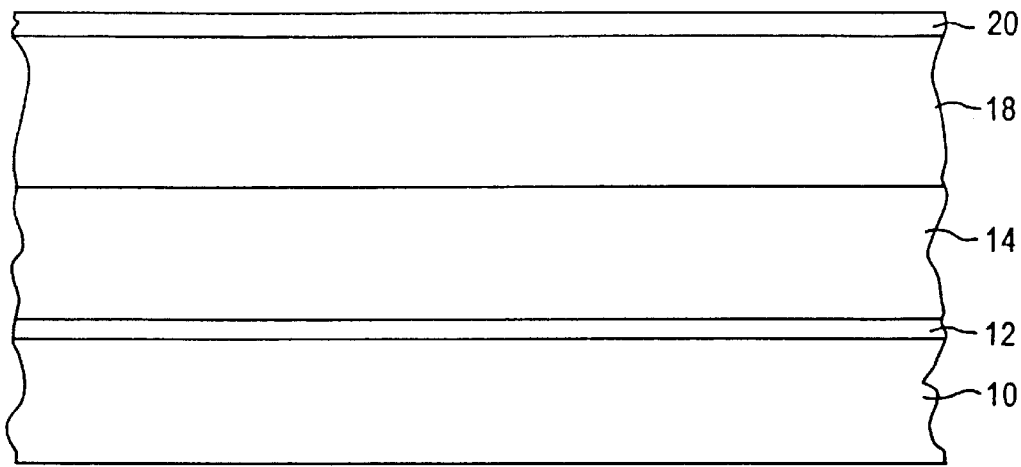
FIG. 4 is a cross-section of the portion of FIG. 5, following the deposition of a hard mask layer on the second low k dielectric layer, in accordance with embodiments of the present invention.

Following the formation of the second dielectric layer 18, a hard mask layer 20 is deposited on the second dielectric layer 18, as depicted in FIG. 4. The hard mask layer 20 may comprise silicon nitride, for example, and serves to selectively protect the second dielectric layer 18 during the etching steps.

Figure 5:
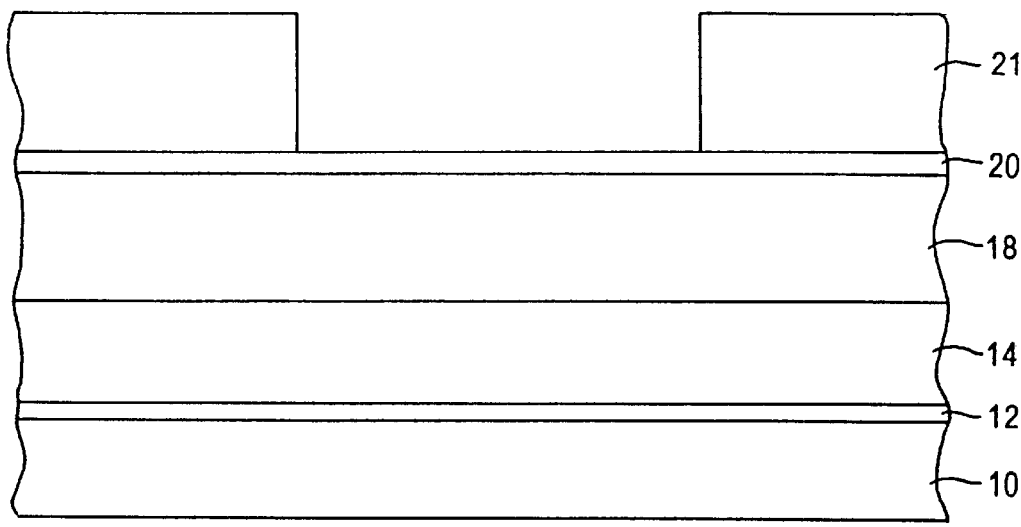
FIG. 5 is a cross-section of the portion of FIG. 4, following the positioning and patterning of a photoresist layer on the hard mask layer to define a first feature to be etched in the hard mask and in the second low k dielectric layer, in accordance with embodiments of the present invention.
Figure 6:
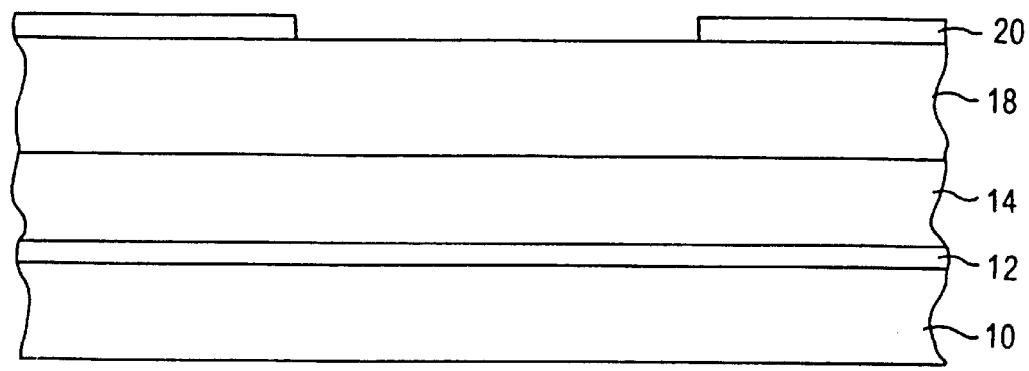
FIG. 6 is a cross-section of the portion of FIG. 5, after the etching of the hard mask layer and the removal of the photoresist layer, in accordance with embodiments of the present invention.

As shown in FIG. 5, a first photoresist layer 21 is then positioned and patterned on the hard mask layer 20. The pattern in the photoresist layer 21 contains the feature, such as a trench, that is to be etched into the second dielectric layer 18. The hard mask layer 20 is then etched through the first photoresist layer 21. A suitable etch chemistry is $CHF_3$/$N_2$, for example. The pattern that will eventually be etched in the second dielectric layer 18 is now transferred to the hard mask layer 20, as depicted in FIG. 6.

Figure 7:
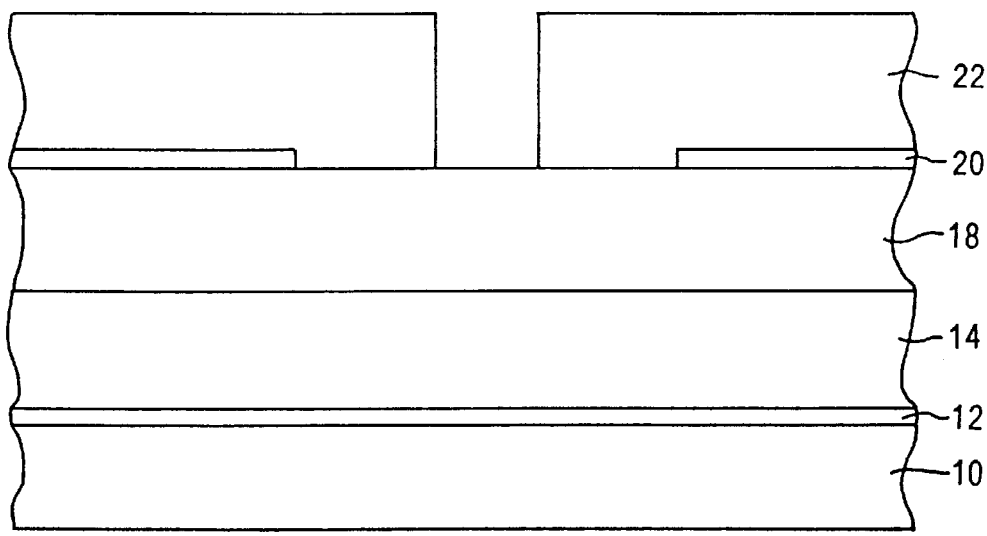
FIG. 7 is a cross-section of the portion of FIG. 6, following the positioning and patterning of another photoresist layer on the hard mask layer to define a second feature to be etched in the first low k dielectric layer, in accordance with embodiments of the present invention.

A second photoresist layer 22 is then positioned and patterned on the hard mask layer 20, as depicted in FIG. 7. The feature (such as a via) desired to be etched into the first dielectric layer 14, is patterned into the second photoresist layer 22. As seen now in FIG. 8, the desired feature (a "first" opening) is created by etching (through the opening in the hard mask layer 20), the second dielectric layer 18, and the first dielectric layer 14. The etching stops at the first etch stop layer 12. In preferred embodiments of the invention, multiple etching steps are used to create the structure depicted in FIG. 8. For example, the second dielectric layer 18 may be etched first, with an etchant chemistry that includes $C_4F_8$/Ar/$C_2F_6$. The first dielectric layer 14 is then etched with $N_2$/$H_2$, and possibly a slight amount of $C_xH_yF_z$, if the low k dielectric material is BCB. The photoresist layer 22 is typically removed by the etching process. If not, a photoresist layer removal step can be performed prior to the etching of the first dielectric layer 14.

Figure 8:
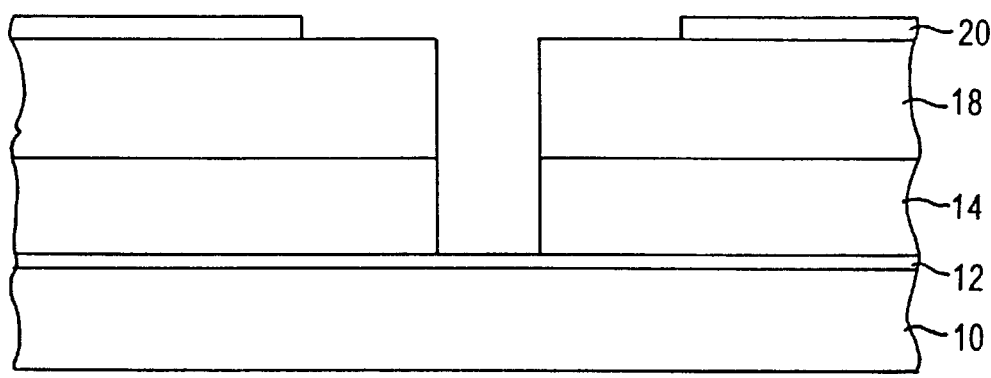
FIG. 8 is a cross-section of the portion of FIG. 7, after etching through the hard mask layer, etching through the second low k dielectric layer, etching through the first low k dielectric layer, and removal of the photoresist layer in accordance with the pattern in the photoresist layer to create a first feature in the first low k dielectric layer, in accordance with embodiments of the present invention.
Figure 9:
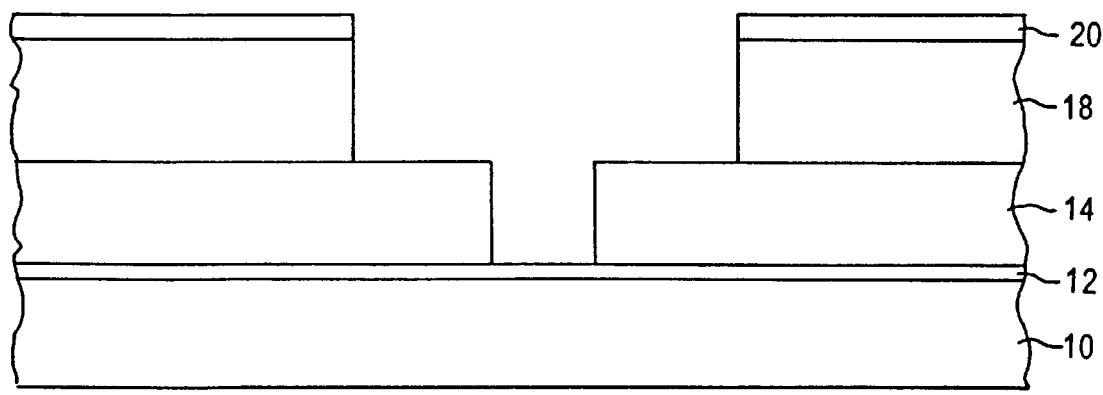
FIG. 9 is a cross-section of the portion of FIG. 8, after etching of the second dielectric layer to form the second feature, in accordance with embodiments of the present invention.

FIG. 9 depicts the cross-section of FIG. 8 following the etching of the second opening in the second dielectric layer 18 through the trench opening created earlier in the hard mask layer 20. The second dielectric layer 18 is etched by $C_4F_8$/Ar/$C_2F_6$, for example. Etching of the first dielectric layer 14 is avoided by the use of this etchant chemistry that does not significantly etch the low k dielectric material in the first dielectric layer 14. This is exemplary only, as other etchant chemistries may be used, provided they will etch the second dielectric layer 18 and not the first dielectric layer 14.

Figure 10:
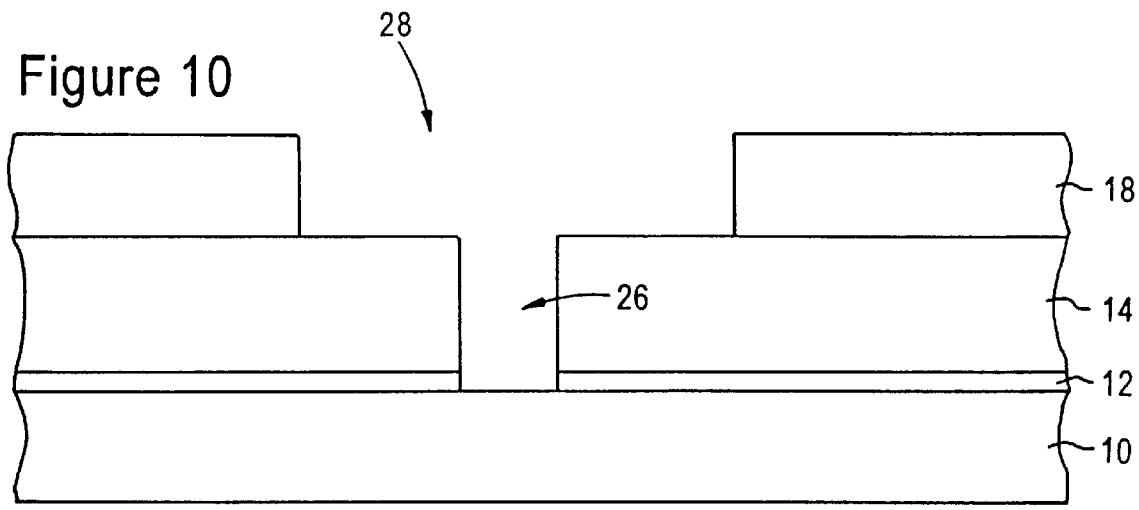
FIG. 10 is a cross-section of the portion of FIG. 9, following the removal of the hard mask layer and etching of the first etch stop layer, in accordance with certain embodiments of the present invention.

The first etch stop layer 12 is then etched within the first opening that now exists in the first dielectric layer 14, as seen in FIG. 10. This removes the etch stop material covering the conductive material in the conductive layer 10. A suitable etchant to remove the etch stop material, for example silicon nitride, while not adversely affecting the conductive material (e.g., copper) is $CHF_3/N_2$, for example. The etching of the first etch stop layer 12 leaves a first opening 26, such as a via hole, and a second opening 28, such as a trench.

Figure 11:
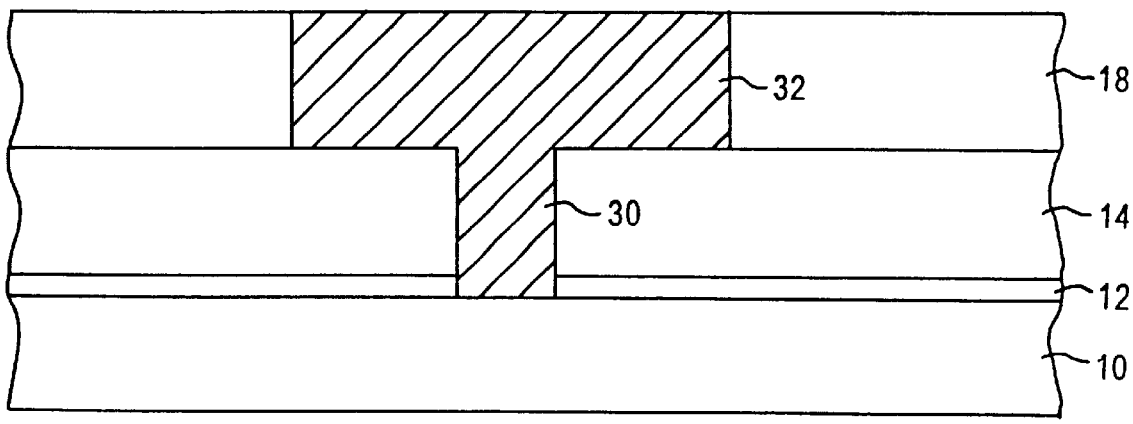
FIG. 11 is a cross-section of the portion of FIG. 10 after the first and second features are filled with a conductive material, in accordance with embodiments of the present invention.

After removal of any remaining photoresist 24, the via hole 26 and the trench 28 are now filled in a simultaneous deposition step with conductive material, preferably copper in certain embodiments of the present invention. After chemical mechanical planarization (CMP), the dual damascene structure of FIG. 11 is formed, having a via (or stud) 30 electrically connecting the underlying conductive layer 10 to a conductive line 32 formed in the trench 28.

FIGS. 12a–12e depict portions of a process to create a dual damascene structure in accordance with alternative embodiments of the present invention. The materials used throughout the structure may be the same as in the above described embodiment, although the location of these materials in the different layers are different than in the first described embodiments. Also, the etchant chemistries used to etch the various materials are the same as those used in the first described embodiments, and therefore are not repeated in the following description.

Figure 12A:
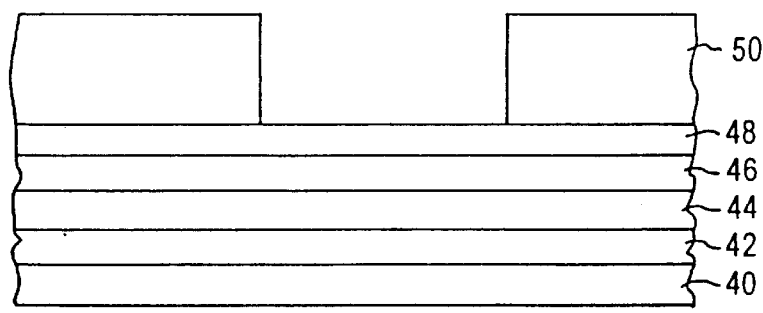
FIGS. 12a–12e depict portions of another embodiment of forming a dual damascene structure in accordance with an embodiment of the present invention.

In FIG. 12a, a cross-section of a portion of a semiconductor wafer is depicted at the same step in he processing as was depicted for the first embodiment of FIG. 5. A first, bottom etch stop layer 40, made of silicon nitride, for example, over a conductive layer (not shown). A first dielectric layer 42 is formed on the bottom etch stop layer 40. In this embodiment, however, the low k material forming the first dielectric layer 42 is an oxide based material, such as HSQ, or SiOF. A second dielectric layer 44 is formed on the first dielectric layer 42. The low k material in the second dielectric layer 44 is a polymer based material, such as BCB.

Two hard masks are provided in the embodiment of FIGS. 12a–12e. The first hard mask layer 46 comprises an oxide, such as silicon dioxide, and is deposited on the second dielectric layer 46. The second hard mask layer 48 is deposited on the first hard mask layer 46, and may comprise silicon nitride, for example. A first photoresist layer 50, which defines the pattern (e.g., a trench) to be etched into the second dielectric layer 46, is positioned and patterned on the second hard mask layer 48.

Figure 12B:
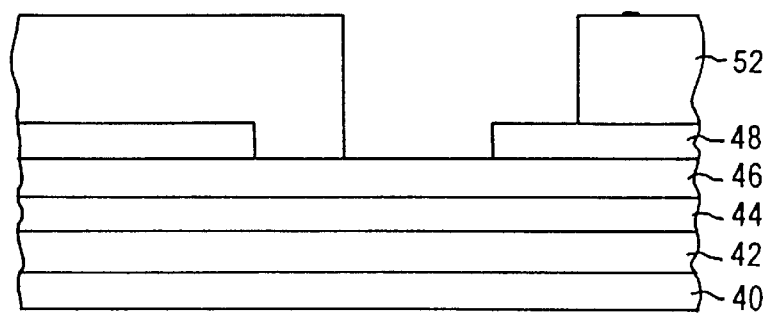

The second hard mask layer 48 is etched through the first photoresist layer 50 to create a trench pattern in the second hard mask layer 48. A second photoresist layer 52 is then positioned and patterned on the second hard mask layer 48 and the first hard mask layer 46. This is depicted in FIG. 12b. The pattern in the second photoresist layer 46 is the pattern (such as a via) that is to be etched into the first dielectric layer 46.

Figure 12C:
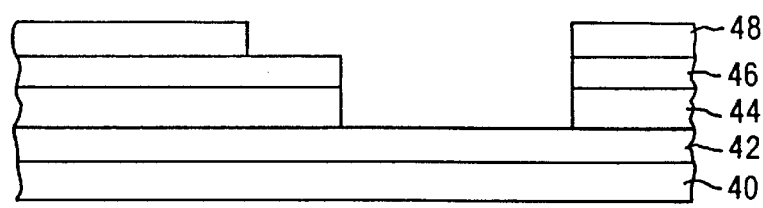

In FIG. 12c, the nitride in the second hard mask layer 48 has been etched by a suitable etchant chemistry, as described earlier. The oxide of the first hard mask layer 46 is also etched by a suitable chemistry. Both mask layers 46, 48 are etched in accordance with the pattern in the second photoresist layer 52. The low k polymer in the first dielectric layer 44 is then etched in accordance with the pattern etched into the first hard mask layer 46. The second photoresist layer 52 is removed at the same time during the etching of the first dielectric layer 44.

Figure 12D:
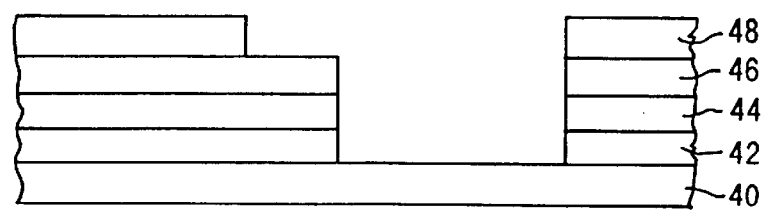
Figure 12E:
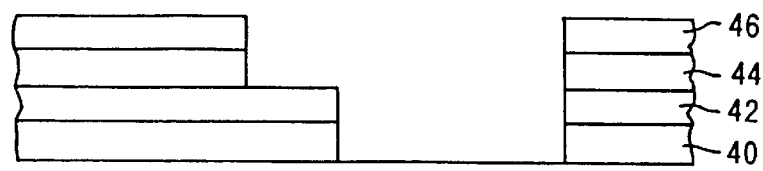

The oxide of the first hard mask layer 46 is now etched, as depicted in FIG. 12d, in accordance with the pattern created in the second hard mask layer 48. This transfers the trench pattern in the second hard mask layer 48 to the first hard mask layer 46. In FIG. 12e, the low k polymer in the second dielectric layer 44 is etched in accordance with the trench pattern created in the first hard mask layer 46. Nitride removal is then performed, which removes the second hard mask layer 48 and the bottom etch stop layer 40. The structure is then ready for further processing to fill with conductive material in a conventional manner.

The use of different types of low k dielectric materials that exhibit different sensitivity to at least one etchant chemistry permits the use of low k dielectric materials in the multiple layers of a dual damascene arrangement, while avoiding the concern of overetching one of the dielectric layers. This use of low k dielectric materials provides a chip with lower overall RC and therefore an improved operating speed.

Although the present invention has been described and illustrated in detail, it is to be early understood that the same is by way of illustration and example only and is not to be taken by way of limitation, the spirit and scope of the present invention being limited only by the terms of the appended claims.

What is claimed is:

1. A method of forming an opening in dielectric interconnect layers, comprising the steps of:

forming a first dielectric layer over a conductive layer, the first dielectric layer comprising a first low k dielectric material;

forming a second dielectric layer on the first dielectric layer, the second dielectric layer comprising a second low k dielectric material having different etch sensitivity than the first low k dielectric material to at least one etchant chemistry;

etching a first opening through the first dielectric layer; and etching a second opening in the second dielectric layer, the second opening at least partially overlapping the first opening, wherein the first opening and the second opening are etched with oxygen-free etchant chemistries.

2. The method of claim 1, wherein the first low k dielectric material is an oxide based material and the second low k dielectric material is a polymer based material.

3. The method of claim 2, wherein the first low k dielectric material is selected from one of hydrogen silsesquioxane (HSQ) and SiOF, and the second low k dielectric material is selected from one of benzocyclobutene (BCB) and FLARE.

4. The method of claim 1, wherein the first low k dielectric material is a polymer based material and the second low k dielectric material is an oxide based material.

5. The method of claim 4, wherein the first low k dielectric material is selected from one of benzocyclobutene (BCB) and FLARE, and the second low k dielectric material is selected from one of HSQ and SiOF.

6. The method of claim 1, further comprising forming a first hard mask layer on the second dielectric layer prior to etching the first and second openings.

7. The method of claim 6, wherein etching the first opening includes creating a first opening pattern in the hard mask layer and etching the first opening through the second dielectric layer and the first dielectric layer in accordance with the first opening pattern in the hard mask layer.

8. The method of claim 7, wherein the step of etching the first opening includes using an etchant chemistry that etches both the first and second dielectric layers.

9. The method of claim 7, further comprising creating a second opening pattern in the hard mask layer after etching of the first opening.

10. The method of claim 9, wherein the step of etching the second opening includes etching the second opening in the second dielectric layer through the second opening pattern in the hard mask layer, and stopping etching at the first dielectric layer.

11. The method of claim 1, wherein the first dielectric layer comprises an oxide based low k dielectric material and the second dielectric layer comprises a polymer based low k dielectric material, and the etchant chemistry used to etch the second dielectric layer includes $C_4F_8/Ar/C_2F_6$, and the etchant chemistry used to etch the first dielectric layer includes $N_2/H_2$, with slight $C_XH_YO_Z$ gas.

12. The method of claim 1, wherein the second dielectric layer comprises an oxide based low k dielectric material and the first dielectric layer comprises a polymer based low k dielectric material, and the etchant chemistry used to etch the first dielectric layer includes $C_4F_8/Ar/C_2F_6$, and the etchant chemistry used to etch the second dielectric layer includes $N_2/H_2$, with slight $C_XH_YO_Z$ gas.

13. The method of claim 8, further comprising forming an additional hard mask layer on the hard mask layer; creating a pattern in the additional hard mask layer; and etching the second opening in accordance with the pattern created in the additional hard mask layer into the second dielectric layer after the first opening is etched in the first dielectric layer.

* * * * *